(12) United States Patent
Khayrallah

(10) Patent No.: US 7,242,914 B2
(45) Date of Patent: Jul. 10, 2007

(54) METHOD OF AUTOMATIC GAIN CONTROL FOR MULTIPLE RECEIVER FRONT-ENDS

(75) Inventor: Ali S. Khayrallah, Cary, NC (US)

(73) Assignee: Telefonaktiebolaget LM Ericsson (publ) (SE)

( * ) Notice: Subject to any disclaimer, the term of this patent is extended or adjusted under 35 U.S.C. 154(b) by 428 days.

(21) Appl. No.: 10/869,761

(22) Filed: Jun. 16, 2004

(65) Prior Publication Data

US 2005/0282509 A1 Dec. 22, 2005

(51) Int. Cl.
*H04B 1/06* (2006.01)
(52) U.S. Cl. ............................... 455/232.1; 455/234.1; 455/245.1
(58) Field of Classification Search ............. 455/232.1, 455/250.1, 234.1, 243.1, 240.1, 132, 245.2, 455/247.1, 251.1, 245.1, 67.11, 226.1
See application file for complete search history.

(56) References Cited

U.S. PATENT DOCUMENTS

| | | | |
|---|---|---|---|
| 3,934,204 A | 1/1976 | Hill | |
| 4,255,816 A | 3/1981 | Grunza et al. | |
| 4,641,141 A | 2/1987 | Masak | |
| 5,768,698 A * | 6/1998 | Kinoshita | 455/273 |
| 6,201,954 B1 * | 3/2001 | Soliman | 455/226.2 |
| 6,628,932 B1 * | 9/2003 | Myers | 455/232.1 |
| 6,748,200 B1 | 6/2004 | Webster et al. | 455/234.1 |
| 6,799,024 B2 * | 9/2004 | Wang et al. | 455/250.1 |
| 7,116,955 B2 * | 10/2006 | Schaffer et al. | 455/250.1 |
| 2002/0061738 A1 * | 5/2002 | Simmons et al. | 455/234.1 |
| 2002/0181627 A1 | 12/2002 | Wengler | |
| 2003/0100281 A1 | 5/2003 | Zipper | |
| 2003/0114126 A1 * | 6/2003 | Wang et al. | 455/234.2 |
| 2003/0152173 A1 | 8/2003 | Strolle et al. | |
| 2003/0169706 A1 | 9/2003 | Poegel et al. | |
| 2004/0152429 A1 * | 8/2004 | Haub et al. | 455/102 |
| 2005/0143117 A1 * | 6/2005 | Jalloul et al. | 455/67.11 |

FOREIGN PATENT DOCUMENTS

| | | |
|---|---|---|
| EP | 0859462 | 8/1998 |
| EP | 1 091 447 A1 | 4/2001 |
| EP | 1209870 | 5/2002 |
| JP | 04-249431 | 9/1992 |
| JP | 05235861 | 9/1993 |
| JP | 08-223098 | 8/1996 |
| JP | 2002-217914 | 8/2002 |
| WO | WO 02/054625 A2 | 7/2002 |

* cited by examiner

*Primary Examiner*—Lana N. Le
(74) *Attorney, Agent, or Firm*—Coats & Bennett, P.L.L.C.

(57) ABSTRACT

A gain processor circuit calculates a first AGC signal for a first one of a number of receive chains, each including a gain-controlled front-end circuit, and derives one or more additional AGC signals from the calculation of that first AGC signal for any remaining chains. The first AGC signal may be calculated by tracking received power for one or more of the receive chains. An AGC signal may be derived for each additional receive chain by assuming that its received power is the same, i.e., the same AGC command is used. Alternatively, an additional AGC command is derived based on a scaling value determined from a ratio of received powers for the first and additional receive chains. Such powers may be expressed as channel tap powers, which may be available from other circuit elements associated with signal demodulation. Alternatively, the scaling value further incorporates received interference and/or noise powers.

39 Claims, 4 Drawing Sheets

METHOD OF AUTOMATIC GAIN CONTROL FOR MULTIPLE RECEIVER FRONT-ENDS

BACKGROUND OF THE INVENTION

The present invention generally relates to communication signal receivers, and particularly relates to automatic gain control in the context of multiple receive chains.

Communication receivers typically include a receive chain that comprises a front-end circuit providing initial signal conditioning and amplification of an antenna-received signal. Such front-end circuits vary in detail depending on the nature of the received signals and the particular implementation of the associated communication receiver, but most receivers implement some form of automatic gain control (AGC) for such front-end circuits.

With AGC, the gain (or gains) of the front-end circuit is varied responsive to changing received signal strength, which itself is subject to rapid changes due to changing fading and interference conditions. The overriding goal of AGC is to maintain the received signal in a useful amplitude range, while avoiding a saturation condition in any of the receive chain circuitry. For example, assuming that the received signal as output from the front-end circuit is digitized for subsequent baseband processing, AGC would be used to maintain the received signal at a reasonable amplitude relative to the input voltage range of the Analog-to-Digital Converter (ADC), without exceeding that input range.

Processing the baseband samples provided by the ADC to determine received signal strength (or power) provides a mechanism for generating AGC commands. Because of the need to maintain the rapidly changing received signal within an appropriate signal range, e.g., properly scaled relative to the dynamic range of the ADC and within the voltage limits of the receive chain amplifiers, etc., such baseband processing typically is carried out at a high rate. Although AGC processing may be carried out in software, dedicated hardware oftentimes is used to support the high processing rates.

In either case, the performance capabilities of the baseband circuit tasked with supporting the AGC function must be commensurate with the AGC performance requirements. While meeting those requirements is practicable in receiver configurations that use a single receive chain, meeting them for multiple receive chains may be onerous. That is, implementing a separate AGC function for each one of multiple receive chains may be impractical in terms of the baseband resources consumed or the overall level of performance required (i.e., processor clock speed, power, etc.).

SUMMARY OF THE INVENTION

The present invention comprises a method and apparatus providing AGC functions in a wireless communication receiver that includes more than one receiver front-end circuit, each of which may correspond to a different receiver antenna. Broadly, the present invention implements a first AGC function, which may comprise smoothing power measurements taken for a first one of the receiver front-end circuits and generating first AGC commands therefrom, and further deriving additional AGC commands for additional receiver front-end circuits from the first AGC function. Such derivation may comprise, for example, using the same AGC commands for additional front-end circuits, or scaling the measurements made by the first AGC function to obtain AGC commands for the additional front-end circuits.

Thus, rather than using unnecessarily duplicative hardware and/or software to independently generate AGC commands for each receiver front-end circuit, an exemplary receiver according to the present invention derives additional AGC commands based on scaling or otherwise modifying the first AGC commands or, equivalently, scaling the AGC measurements used to generate the first AGC commands. The present invention therefore provides a method for deriving AGC commands for a second (third, etc.) receive chain from the AGC function dedicated to a first receive chain. Such derivation may be based on the relative received signal powers, relative noise and interference, etc., of the chains, and the invention has exemplary application to cellular communication receivers, such as WCDMA, GSM/EDGE, and cdma2000, and to other wireless systems such 802.11 and Bluetooth short-range radio networks.

As such, an exemplary AGC circuit for use in a wireless communication terminal that includes at least first and second receiver front-end circuits comprises a gain processor circuit configured to calculate a first AGC signal for controlling a gain of the first receiver front-end circuit based on evaluating received signal samples from the first receiver front-end circuit, and to derive a second AGC signal from the calculation of that first AGC signal for controlling a gain of the second receiver front-end circuit. The exemplary AGC circuit may further comprise, or may be associated with, an output circuit configured to output the first and second AGC signals for controlling the gains of the first and second receiver front-end circuits, respectively. In other exemplary embodiments, the AGC circuit derives one or more AGC signals based on receiving a combination of received signal samples from two or more front-end circuits.

An exemplary method of automatic gain control in a wireless communication terminal comprising two or more receiver front-end circuits thus comprises computing a first AGC signal based on evaluating received signal samples from at least a first one of the receiver front-end circuits, deriving one or more additional AGC signals from the calculation of that first AGC signal. The exemplary method may further comprise controlling a gain of the first receiver front-end circuit via the first AGC signal, and controlling gains of the one or more additional receiver front-end circuits via the one or more additional AGC signals.

Further, an exemplary wireless communication terminal for use in a wireless communication network comprises a receiver that includes at least first and second receiver front-end circuits, wherein the receiver includes an AGC circuit comprising a gain processor circuit. The exemplary gain processor circuit, which may be implemented in hardware, software, or any combination thereof, is configured to calculate a first AGC signal for controlling a gain of the first receiver front-end circuit based on evaluating received signal samples from at least the first receiver front-end circuit, and to derive a second AGC signal from the first AGC signal for controlling a gain of the second receiver front-end circuit. The exemplary gain processor circuit further includes, or is associated with, an output circuit configured to output the first and second AGC signals for controlling the gains of the first and second receiver front-end circuits, respectively.

Of course, the present invention is not limited to the above details. Indeed, those skilled in the art will recognize additional features and advantages of the present invention upon reading the following detailed description and upon viewing the accompanying figures in which like elements are assigned like reference numbers.

DETAILED DESCRIPTION OF THE INVENTION

Figure 1:
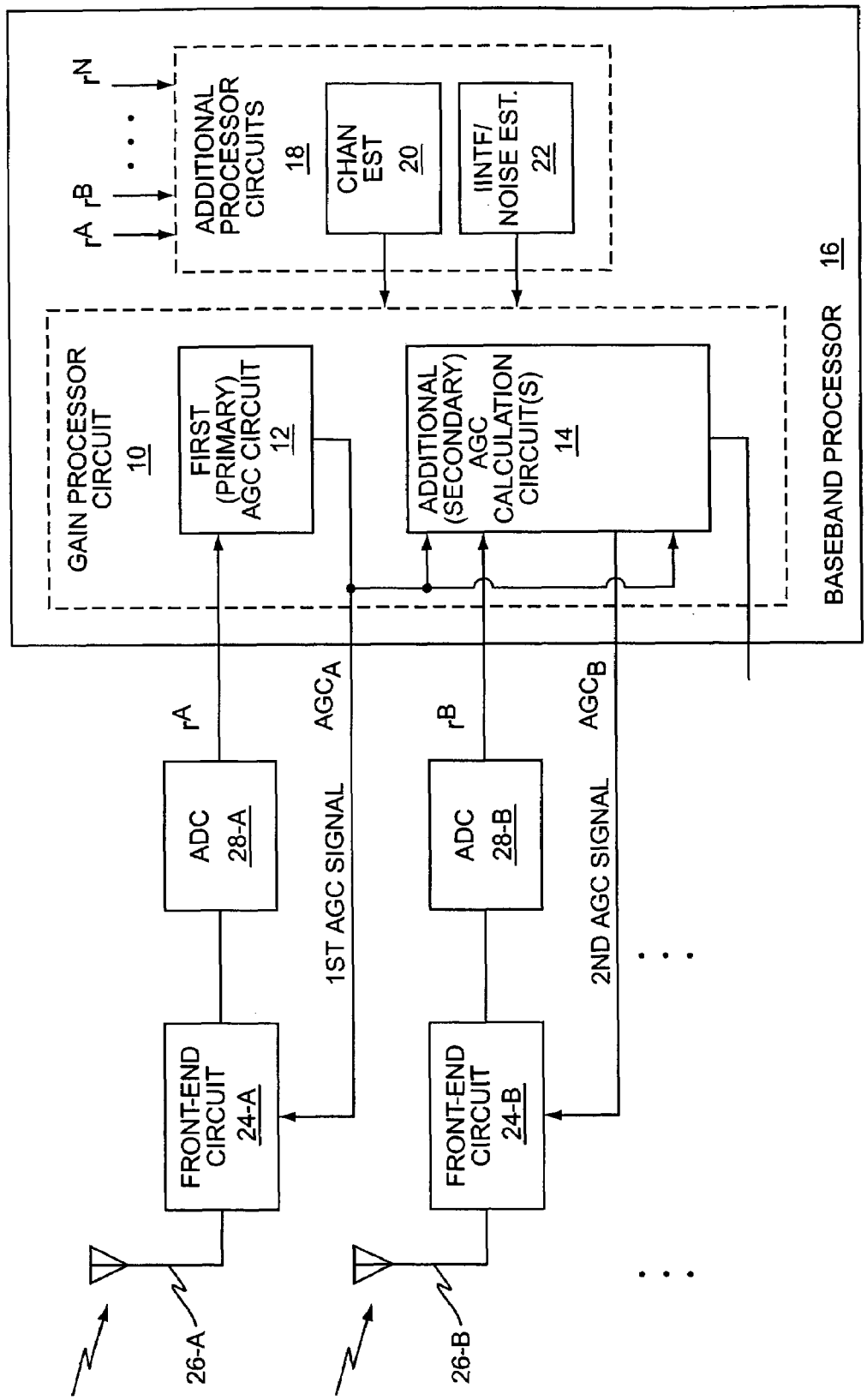
FIG. 1 is a diagram of an exemplary gain processor circuit configured to provide AGC signal calculation in accordance with one or more embodiments of the present invention.

FIG. 1 illustrates an exemplary gain processor circuit 10 that comprises a first (primary) AGC calculation circuit 12 and one or more additional (secondary) AGC calculation circuits 14. By way of non-limiting example, gain processor circuit 10 may be implemented as part of a baseband processor 16 that further comprises one or more additional processing circuits 18, such as a channel estimation circuit 20 and an interference/noise estimation circuit 22. While not explicitly shown in FIG. 1, it should be understood that baseband processor 16 itself might comprise a portion of a communication receiver. Further, it should be noted that throughout this document the term "comprises" is to be considered a non-limiting term of inclusion that identifies an open-ended listing of components, functions, steps, etc.

The illustration further depicts the association of gain processor circuit 10 with two or more receiver front-end circuits 24. Front-end circuits 24-A and 24-B are illustrated but it should be understood that any number of additional front-end circuits 24 may be implemented. Front-end circuit 24-A is associated with a corresponding receiver antenna 26-A, also referred to herein simply as antenna A, and is further associated with an Analog-to-Digital Converter (ADC) 28-A that outputs digital samples, $r^A$, corresponding to the signal received on antenna A. Likewise, front-end circuit 24-B is associated with antenna 26-B (antenna B) and ADC 28-B, which provides digital samples, $r^B$, corresponding to the signal received on antenna B. Note that the received signals, $r^A$, $r^B$, and so on, generally are provided to the additional processing circuits 18 for computation of channel estimates, interference/noise estimation, etc.

For purposes of discussion herein, "receive chain A" at least comprises front-end circuit 24-A, and "receive chain B" at least comprises front-end circuit 24-B. More generally, receive chains A and B may include ADC 28-A and ADC 28-B, respectively, and any other antenna-specific circuitry.

Front-end circuits 24 each comprise one or more gain stages, and typically include filtering, amplification, and down-conversion functions that operate on signal(s) received on the corresponding one of antennas 26. A principal aim of front-end gain control is to keep the signal output from each front-end circuit 24 within the useful input signal range of the corresponding ADC 28, while at the same time avoiding saturation at any stage within the front-end circuit 24.

In this context, the exemplary gain processor circuit 10 generates a first AGC signal for one of the front-end circuits 24, and derives one or more additional AGC signals for the remaining front-end circuits 24 based on that first AGC signal. By way of non-limiting example, gain processor circuit 10 generates an AGC signal for front-end circuit 24-A ($AGC_A$) and then derives an AGC signal for front-end circuit 24-B, $AGC_B$, from $AGC_A$. In this manner, the hardware and/or software resources given over to the initial AGC signal computation need not be duplicated for each receiver front-end circuit 24.

In looking at the generation of that "first" AGC signal, those skilled in the art will appreciate that a given received signal, particularly in the context of a wireless communication network, comprises potentially many different components, including the desired signal, other cell interference, adjacent carrier interference, and internal receiver noise. In baseband, the received signal from antenna A can be written as $$r_n^A = C^A * s_n + i_n^A + w_n^A, \qquad (1)$$

where $s_n$ refers to the desired signal information symbols, $C^A = [C_0^A, \ldots, C_{M-1}^A]$ is a vector of M channel tap estimates for receiver front-end circuit 24-A, (*) denotes a convolution, $i_n^A$ refers to the co-channel and adjacent channel interference, and $w_n^A$ refers to all other noise for the receiver chain associated with antenna A, i.e., front-end circuit 24-A, ADC 28-A, etc. The received signal for other chains can be expressed similarly. For a TDMA system, such as GSM/EDGE, received information symbols represent a single user, e.g. a GMSK or 8PSK sequence. However, in a CDMA system, such as WCDMA or cdma2000, the received information symbols are combinations of the symbols of multiple users. In both cases, one still may treat the whole transmitted signal as the "desired" signal for purposes of AGC.

As noted above, a primary goal of AGC is the generation of gain commands that keep the received signal from each front-end circuit 24 in the appropriate signal range. Gain processor circuit 10 accomplishes this by implementing a first AGC function based on processing received signal samples from one or more of the receiver front-end circuits 24 and generating a first AGC signal based on that processing. Additional AGC signals are derived from that first AGC function. Broadly, the same AGC commands may be used for any additional receiver front-end circuits 24. Alternatively, the AGC commands for any one or more of the additional receiver front-end circuits 24 may be derived based on scaling or otherwise manipulating that first AGC signal or, equivalently, scaling the underlying measurements on which it was based.

Figure 2:
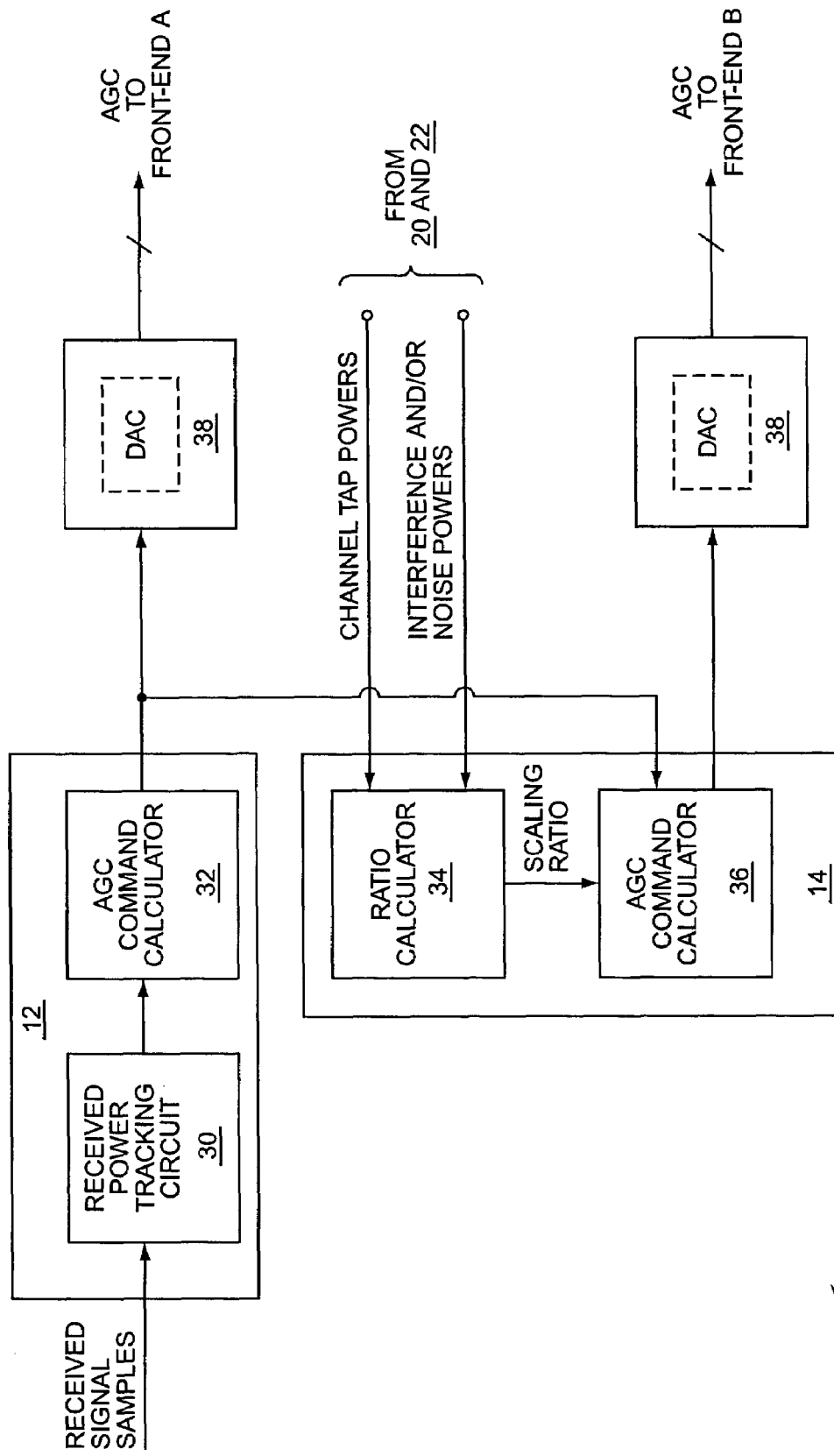
FIG. 2 is a diagram of exemplary details for the gain processor circuit of FIG. 1.

FIG. 2 illustrates exemplary details for gain processor circuit 10 and provides a basis for discussing such operations. As shown in FIG. 2, the primary AGC circuit 12 of gain processor circuit 10 may comprise a received power tracking circuit 30, and an AGC command calculator 32, while the secondary AGC circuit 14 may comprise a ratio calculator 34 and an AGC command calculator 36—these functions of secondary AGC circuit 14 may be "repeated" in hardware or software for each additional receive chain, or may be reused for any such additional receive chains. Indeed, it should be noted that the architecture of gain processor circuit 10 illustrated in FIG. 2 may represent a functional rather than physical arrangement of logical circuits.

Regardless, the resulting AGC commands, each of which may comprise control values for one or more front-end gain stages, may be provided to the corresponding receiver front-end circuits 24 via an output circuit 38, which may include output DACs to convert digital AGC commands to analog control signals. Of course, front-end circuits 24 may be configured to receive digital AGC commands, in which case the generated AGC commands may be output without analog conversion.

In any case, AGC circuit 12 may be configured to estimate the amplitude or the power of received signal samples from one, or more than one, of the receiver front-end circuits 24 by averaging those received samples over a block, and then smoothing that average across multiple blocks. For instance, it may be convenient to configure tracking circuit 30 to maintain a received signal power estimate for signal samples from antenna A, denoted as $P_k^A$, by averaging the signal samples from receiver front-end circuit 24-A over a time window or slot of length L. This operation can be expressed as $$P_k^A = \frac{1}{L} \sum_{n=(k-1)L}^{kL-1} |r_n^A|^2, \qquad (2)$$

where the values $r_n^A$ are the "raw" signal samples received via antenna A. The results of such power calculations can be smoothed further, using an exponential filter, for instance, to obtain $$Q_k^A = (1-\epsilon)Q_{k-1}^A + \epsilon P_k^A. \qquad (3)$$

where the parameter $\epsilon$ determines the amount of smoothing. Less smoothing enables the estimate to track short term fading better at the expense of letting in more noise, while more smoothing better suppresses the noise, however, it can compromise tracking ability.

The AGC commands for front-end circuit 24-A are thus calculated by AGC command calculator 32 as a function of the smoothed values of received power for front-end circuit 24-A, i.e., according to Eq. 4

$$AGC_A = f(Q_k^A) \qquad (4)$$

The AGC command may be an absolute setting of the gain, or it may be a relative setting of the gain, in the form of an increase or a decrease with respect to the present gain value. The averaging and smoothing operations supporting such AGC command calculations for receive chain A can be carried out by tracking circuit 30 based on implementing them in hardware or software, or in some combination thereof. Preferably, tracking circuit 30 is configured to carry out such operations at a fairly high rate relative to the fading dynamics of the received signal, such that power tracking operations follow changing received signal conditions. Because of that high-rate processing, it may be disadvantageous in terms of economic and performance constraints to implement a tracking circuit 30 for each receive chain.

Rather than duplicating such processing for each additional receiver chain, gain processor circuit 10 uses the secondary AGC calculation circuit 14 to derive the AGC commands for any additional receiver chains. That is, additional AGC signals for any additional receive chains are derived from the first AGC signal calculation. In a first exemplary embodiment of such AGC command derivation, the secondary AGC circuit 14 sets a received signal power estimate for receiver chain B equal to that calculated for receiver chain A. That is, $$Q_k^B \equiv Q_k^A \text{ or, equivalently, } AGC_B = AGC_A. \qquad (5)$$

In other words, if the secondary AGC circuit 14 performs the same gain control calculations as that performed by the primary AGC circuit 12 based on tracked power, the assumption of received power equality between both chains results in the same AGC commands being generated for both receive chains A and B.

Therefore, in the above embodiment, receive chain A has a dedicated AGC function producing the smoothed estimates $Q_k^A$, which are translated into gain settings for front-end circuit 24-A. Chain B does not have a dedicated AGC function, but rather the AGC commands for front-end circuit 24-B are generated by using $\tilde{Q}_k^B = Q_k^A$ as an estimate for the actual smoothed value of received power for receiver chain B, $Q_k^B$, which translates into the same AGC commands for chain B.

Those skilled in the art will appreciate that the AGC commands for each chain may be generated as single signal, or as multiple signals, in dependence on the number and type of gain stages in each of the corresponding receiver front-end circuits 24. On that point, those skilled in the art will appreciate that the particular form in which the AGC signals are generated depends on the particular receiver structure involved, e.g., super heterodyne, homodyne, etc., and on the particular configuration of the front-end circuits 24, e.g., single stage, multi-stage, etc.

Regardless of these implementation details, configuring the gain processor circuit 10 to derive additional gain control signals by duplicating the first gain control signals can yield reasonably good AGC performance for all receive chains, particularly in the context of a relatively small communication device where it is likely that the signals received for the different receive chains are highly correlated. The approach may be particularly preferable in the illustrated example where receiver chain B is used as a supplemental chain to boost receiver performance. However, it should be understood that the present invention is not limited to such scenarios.

In another embodiment, generation of the AGC commands for additional receive chains exploits knowledge of parameters estimated for the purposes of demodulation. Such parameters may include the "channel tap" powers for receive chains A and B. Here, the term "channel tap" refers to the communication channel estimates for the received signal(s), and may be obtained from received pilot signal information. In CDMA implementations, channel tap information may be based on pilot symbols and/or pilot codes received via the different receive chains, and in TDMA implementations, such information by be obtained by processing training sequence information received by the different receive chains. For systems that do not transmit pilot information, it is possible to estimate channel taps blindly. For instance, demodulated data symbols can be exploited by a decision feedback process to estimate the channel taps. Even in the presence of pilot information, it may be beneficial to use both pilot-assisted and blind estimation to improve the quality of the channel tap estimates.

In either instance, the gain processor circuit 10 may be configured to carry out a more nuanced method of deriving AGC signals for receive chain B by scaling the smoothed power estimates used to generate such commands based on the ratio of received signal powers for receive chain A and receive chain B. Basing such power scaling on pilot signal power, i.e., channel tap power, does not add undue processing overhead because such values typically are computed at a lower rate than the raw power estimation carried out by tracking circuit 30, and typically are performed by baseband processor 16 for reasons independent of AGC command derivation. That is, channel tap power values would already be available in a typical communication receiver. Thus, the use of channel tap powers in AGC command generation represents an advantageous "extra" use of such information within baseband processor 16.

Ratio calculator 34 of the secondary AGC circuit 14 thus may be configured to calculate a scaling ratio ρ based on the channel tap powers for receive chains A and B as $$\rho = \frac{|C_0^B|^2 + \cdots + |C_{M-1}^B|^2}{|C_0^A|^2 + \cdots + |C_{M-1}^A|^2}, \quad (6)$$

to scale $Q_k^A$ and produce the estimate $$\tilde{Q}_k^B = \rho Q_k^A. \quad (7)$$

Where the values $|C_x^A|^2$ and $|C_x^B|^2$ are the channel tap powers for receive chains A and B, a delay number x, respectively, as determined from pilot signal samples received via receive chains A and B. With this embodiment, the AGC commands generated by AGC command generator 36 for front-end circuit 24-B are derived as a function of the scaling ratio applied to the AGC commands generated for front-end circuit 24-A or, equivalently, as a function of that scaling ratio applied to the smoothed received power estimates calculated for receive chain A. For example, AGC circuit 14 may generate AGC commands for receive chain B as $$AGC_B = f(\tilde{Q}_k^B) = f(\rho Q_k^A). \quad (8)$$

If the received signal is dominated by the desired signals, that is $r_n^A \mp C^A * s_n$ and $r_n^B \mp C^B * s_n$, then $\tilde{Q}_k^B$ is a reasonably good approximation to $Q_k^B$. Further, note that channel taps used in the above ratio typically are averaged over multiple observations by channel estimation circuit 20 to enhance their reliability. For instance, they may be estimated using some form of averaging over pilot symbols, or over a pilot channel. Because such channel tap estimates must be reliable enough for the purposes of demodulation, they represent good candidates for use in obtaining a reasonably accurate scaling ratio for derived AGC commands.

In yet another embodiment, derivation of additional AGC commands is based on interference and/or noise estimates. Let $N^A$ and $N^B$ denote the total interference plus noise power estimates on chains A and B. That is, $N^A$ represents the power in the interference component $i_n^A$ and the other noise component $w_n^A$, and similarly for chain B. Such values already may be available based on other received signal processing, such as Signal-to-Noise Ratio (SNR) calculations that may be carried out by interference estimator circuit 22 in baseband processor 16.

Ratio calculator 34 thus can be configured to use the signal and noise power ratio in addition to the earlier discussed channel tap power to compute an AGC command scaling ratio as $$\rho = \frac{N^B + |C_0^B|^2 + \cdots + |C_{M-1}^B|^2}{N^A + |C_0^A|^2 + \cdots + |C_{M-1}^A|^2} \quad (9)$$

to scale $Q_k^A$ and produce the estimate $\tilde{Q}_k^B = \rho Q_k^A$ for derivation of AGC commands for front-end circuit 24-B. As with the channel tap powers, the interference and noise power estimates generally are used for channel estimation and/or power control and thus are averaged to ensure their accuracy. As such, such estimates are suitable for use in AGC command derivation. With the above modification in Eq. 9 to the calculation of ρ, the AGC commands for receive chain B can be computed as in Eq. 8.

In the foregoing examples, it was assumed that the primary AGC calculation circuit 12 received signal samples from receive chain A. However, that configuration may be modified such that AGC calculation circuit 12 receives signal samples from one or more of the receive chains, e.g., it may be configured to receive signals samples from front-end circuits 24-A and 24-B. For example, the output signal samples from ADCs 28-A and 28-B may be interleaved or otherwise mixed, and that combination of signal samples provided as an input to AGC calculation circuit 12.

As a result of such sample combining, the smoothed estimates of received signal power generated by tracking circuit 30, now denoted $Q_k^{AB}$, represent an average of the combination of the two receive chain signals. Corresponding configuration changes may be implemented in the primary and secondary AGC calculation circuits 12 and 14 to account for such an arrangement so that gain processor circuit 10 correctly derives the individual estimates $\tilde{Q}_k^A$ and $\tilde{Q}_k^B$ from $Q_k^{AB}$.

As before, an exemplary configuration uses a straightforward equality. Thus, $$\tilde{Q}_k^A = \tilde{Q}_k^B = 1; 2 Q_k^{AB} \quad (10)$$

serves as the base equations for estimating $Q_k^A$ and $Q_k^B$, which translates into generating the same AGC commands for receive chains A and B. Again, this simpler form of AGC command derivation may be preferably where the received signals on antennas A and B are highly correlated.

Further, as before, AGC command derivation may be based on power scaling using channel tap information. Thus, gain processor circuit 10 may be configured to use the ratio ρ as calculated in Eqs. 6 or 9 to scale $Q_k^{AB}$ and produce the estimates as, $$\tilde{Q}_k^A = \frac{1}{1+\rho} Q_k^{AB} \text{ and } \tilde{Q}_k^B = \frac{\rho}{1+\rho} Q_k^{AB}. \quad (11)$$

(Note that the above equations account for the allocation of total received sample power between receive chains A and B via the 1/(1+ρ) and ρ/(1+ρ) formulations.) With Eq. 11, then, the AGC commands for receive chains A and B would be calculated as functions of their respective estimated received powers, i.e., $$AGC_A = f(\tilde{Q}_k^A) \text{ and } AGC_B = f(\tilde{Q}_k^B) \quad (12)$$

As before, if the received signal is dominated by the desired signals, that is $r_n^A \mp C^A * s_n$ and $r_n^B \mp C^B * s_n$, then $\tilde{Q}_k^A$ and $\tilde{Q}_k^B$ are good approximations to $Q_k^A$ and $Q_k^B$, respectively, and it may be preferable to configure scaling value ρ based on Eq. 6, which considers the relation in channel tap powers between the receive chains. However, if interference and noise terms potentially are significant, then it may be preferable to compute the scaling value ρ based on Eq. 9, which accounts for relative interference and noise powers of the receive chains as well.

Figure 3:
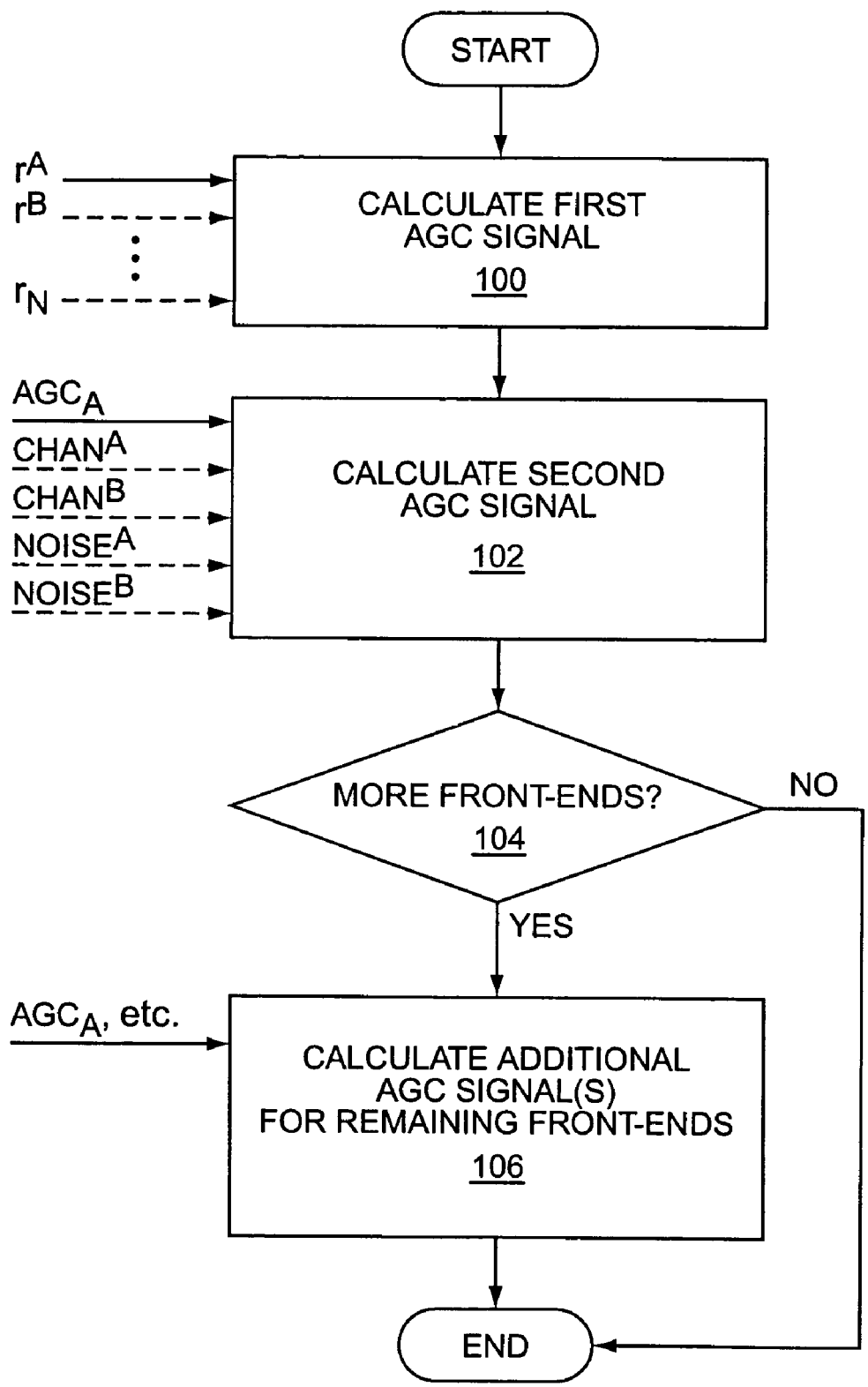
FIG. 3 is a diagram of exemplary processing logic for implementing exemplary AGC signal calculation.

With the above embodiments in mind, FIG. 3 illustrates general processing logic that may be implemented by gain processor circuit 10. Processing begins with gain processor circuit 10 calculating a first AGC signal, $AGC_A$, for a first one of one or more receiver front-end circuits 24 (Step 100). As noted above, that calculation may be based on tracking the received power for at least that first receiver front-end circuit, i.e., based on tracking received signal samples, $r^A$, from the first front-end circuit 24-A. Of course, in one or more embodiments, samples from additional ones of the receiver front-end circuits 24, e.g., from one or more of $r^B$ up to $r_N$, where "N" is any number of receiver front-end circuits 24.

Processing continues with the derivation of a second AGC signal, $AGC_B$, for a second one of the receiver front-end circuits 24 (Step 102). Such derivation may be based simply on setting the second AGC commands equal to the first AGC commands ($AGC_B=AGC_A$), such as by assuming that the received powers of the first and second receiver front-end circuits 24 are the same—see e.g., Eq. (5). Alternatively, such derivation may be based on scaling the measurements on which the first AGC commands are based, or the commands themselves, using a ratio of channel tap powers for the first and second receiver front-end circuits 24 (see e.g., Eq. (6)) or using a ratio of the combined interference and channel tap powers for the first and second receiver front-end circuits 24 (see e.g., Eq. (8)). In either case, the second AGC commands can be generated based on the scaling ratio ρ (see e.g., Eq. (7)).

If there are additional receive chains (Step 104), then gain processor circuit 10 may be configured to derive additional gain control signals for the receiver front-end circuit 24 in each such additional receive chain (Step 106). Such derivations may be based on any one of the above methods of derivation, or on any combination of those methods. On that point, it should be noted that AGC calculation and derivation may be based on signal samples from one receiver front-end circuit 24, or from any combination of two or more such circuits. For example, as noted elsewhere herein, the AGC signal generation may be based on receiving a combination of samples, e.g., interleaved samples from two or more receiver front-end circuits 24.

Broadly, then, the exemplary gain processor circuit 10 may be configured to carry out a method of automatic gain control in a wireless communication terminal comprising two or more receiver front-end circuits by calculating a first automatic gain control signal based on evaluating received signal samples from at least a first one of the receiver front-end circuits 24, and then deriving one or more additional automatic gain control signals from the calculation of that first automatic gain control signal. Processor circuit 10 may directly or indirectly control the gain(s) of the first receiver front-end circuit via the first automatic gain control signal and control the gain(s) of the one or more additional receiver front-end circuits via the one or more additional automatic gain control signals.

With this exemplary method, deriving one or more additional automatic gain control signals from the calculation of the first automatic gain control signal may comprise deriving at least a second automatic gain control signal for a second one of the receiver front-end circuits 24. Further, deriving one or more additional automatic gain control signals from the calculation of the first automatic gain control signal may comprise setting one or more additional automatic gain control signals for a corresponding one or more additional receiver front-end circuits 24 to be equal to the first automatic gain control signal.

Alternatively, deriving one or more additional automatic gain control signals from the calculation of the first automatic gain control signal may comprise, for each additional receiver front-end circuit 24, determining a scaling value relating the first receiver front-end circuit 24 to the additional receiver front-end circuit 24, obtaining a scaled measurement by applying the scaling value to a measurement used in calculating the first automatic gain control signal, and calculating the automatic gain control for the additional receiver front-end circuit 24 based on the scaled measurement. The scaling value relating to the first receiver front-end circuit 24 to the additional receiver front-end circuit 24 may be determined as a ratio of channel tap powers between the first receiver front-end circuit 24 and the additional receiver front-end circuit 24, or determined as a ratio of channel tap and interference powers between the first receiver front-end circuit 24 and the additional receiver front-end circuit 24.

Further, as described in detail above, calculating a first automatic gain control signal based on evaluating received signal samples from at least a first one of the receiver front-end circuits may comprise maintaining an estimate of received signal power based on received signal samples from at least the first receiver front-end circuit 24 and calculating the first automatic gain control signal therefrom. With that embodiment, deriving one or more additional automatic gain control signals from the calculation of the first automatic gain control signal may comprise scaling the estimate of received signal power for an additional receiver front-end circuit 24 and calculating the automatic gain control signal for that additional receiver front-end circuit 24 based on the scaled estimate of received signal power.

In this regard, scaling the estimate of received signal power for an additional receiver front-end circuit 24 may comprise determining a ratio relating channel tap powers of the first and additional receiver front-end circuits 24, and applying that ratio to the estimate of received signal power. The ratio may further be based on relating interference and noise powers of the first and additional receiver front-end circuits 24.

Figure 4:
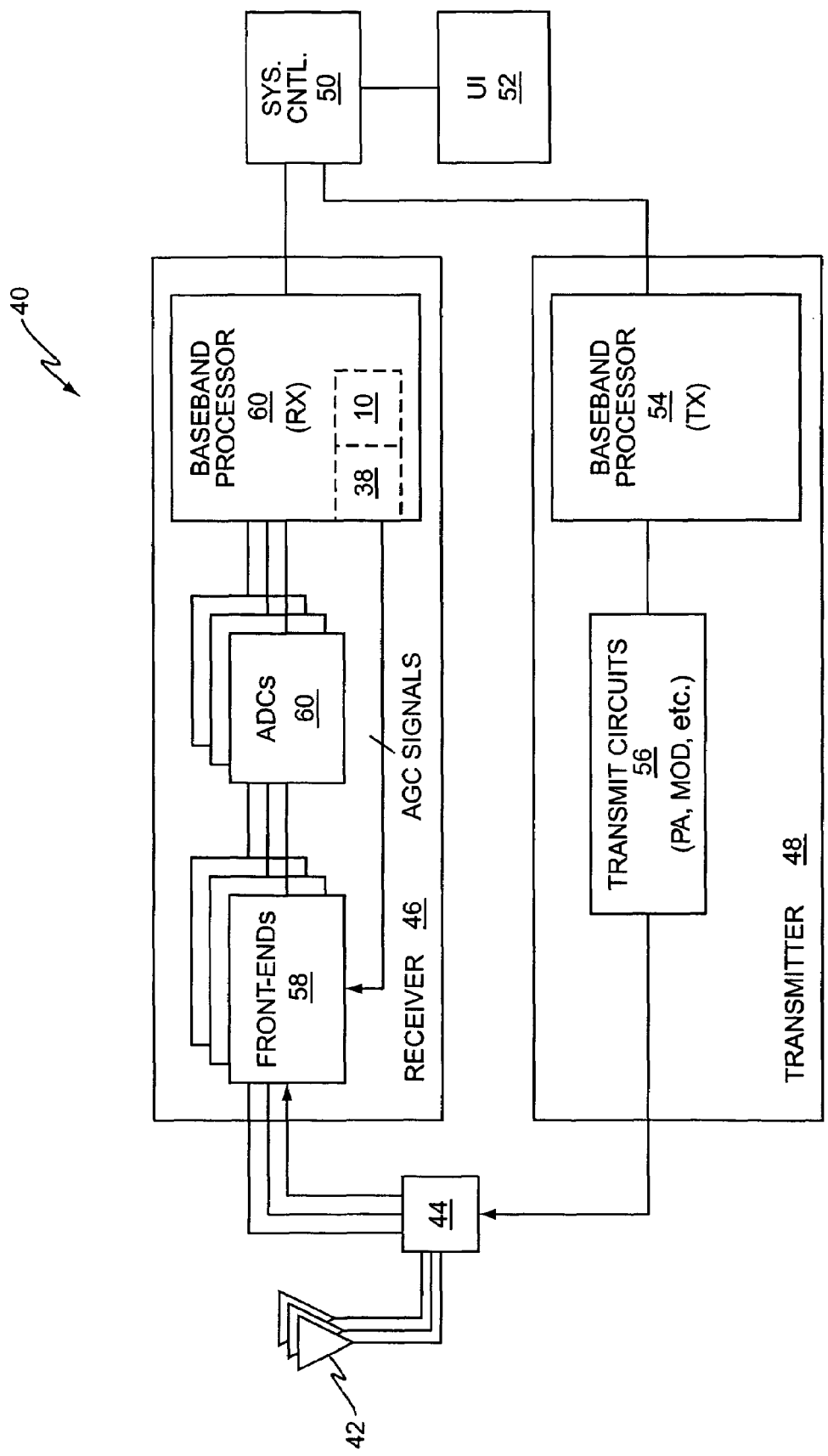
FIG. 4 is a diagram of an exemplary wireless communication device in which the exemplary gain processor circuit of FIG. 1 may be implemented.

The above processing logic, or variations thereof, may be embodied in the exemplary communication device 40 illustrated in FIG. 4. Device 40 may comprise, but is not limited to, a wireless mobile terminal, such as a cellular radiotelephone for use in a cellular communication network, a portable digital assistant (PDA), a pager, a laptop/palmtop computer, or other type of portable communication device.

The exemplary device 40 comprises one or more antennas 42, here configured as transmit/receive antennas, a duplexer/switch circuit 44 coupling the antennas 42 to a receiver 46 and a transmitter 48, a system controller 50, and a user interface 52. System controller 50 may comprise a microprocessor, microcontroller, an ASIC, a FPGA, or other processing circuit that is configured to control overall operations of device 40 and, particularly, to manage the user interface 52, which may comprise, for example, a keypad, display, speaker, and microphone. Transmitter 48 comprises a baseband transmit processor 54, and associated transmit circuits 56, e.g., modulator, power amplifier, etc.

Of more particular interest with respect to the present invention, however, the exemplary receiver 46 comprises a number of receiver front-end circuits 58, which may be configured the same or similar as the previously illustrated receiver front-end circuits 24, and a number of corresponding ADCs 60 to convert the output signal from each front-end circuit 58 into digital samples for input to baseband receive processor 60, which may be configured the same as or similar to the previously illustrated baseband processor 16.

Specifically, baseband receive processor 60 may be configured to include any one or more of the previously described embodiments of gain processor circuit 10, and may further include embodiments of the previously described channel and interference estimation circuits 18 and 20, and the AGC signal output circuit 38. With such a configuration, then, the device 40 may be configured to carry out exemplary AGC signal generation for a first one of its front-end circuits 58, and the derive additional AGC signals for any remaining ones of its front-end circuits 58 based on that first AGC signal.

Those skilled in the art should appreciate that the illustrated architecture of device 40 is exemplary only, and can be changed according to design needs in dependence on the intended use of device 40. Further, it should be understood that the baseband processors 54 and 60 may be integrated into a combined baseband processor circuit, e.g., a digital signal processor (DSP) or ASIC configured for baseband transceiving operations. As such, the present invention is not limited by the implementation details of device 40.

Indeed, the present invention broadly provides an exemplary method and apparatus for deriving one or more additional AGC signals from a first AGC signal. Generation of that first AGC signal may be based on dedicated hardware, software, or any combination thereof, and may comprise tracking received signal power for one or more receiver front-end circuits subject to AGC. However, rather than duplicate that full AGC generation function for each additional front-end circuit, the present invention derives one or more additional AGC signals based on the calculation of that first AGC signal. As such, the present invention is not limited by the foregoing discussion but rather is limited only by the following claims and their reasonable equivalents.

What is claimed is:

1. An automatic gain control circuit for use in a wireless communication terminal comprising at least first and second receiver front-end circuits having individual gain controllability, the automatic gain control circuit comprising:
    a gain processor circuit configured to:
        generate an estimate of received signal power for at least the first receiver front-end circuit, and calculate a first automatic gain control signal for controlling a gain of the first receiver front-end circuit based on the estimate of received signal power; and
        derive a second automatic gain control signal from the calculation of the first automatic gain control signal for controlling a gain of the second receiver front-end circuit by generating a scaled estimate of received signal power for the second receiver circuit based on scaling the estimate of received signal power, and calculating the automatic gain control signal for the second receiver circuit based on the scaled estimate.

2. The automatic gain control circuit of claim 1, further comprising an output circuit configured to output the first and second automatic gain control signals for controlling the gains of the first and second receiver front-end circuits, respectively.

3. The automatic gain control circuit of claim 1, wherein the gain processor circuit comprises a first gain control calculation circuit configured to calculate the first automatic gain control signal, and a second gain control calculation circuit configured to derive the second automatic gain control signal from the calculation of the first automatic gain control signal.

4. The automatic gain control circuit of claim 1, wherein the gain processor circuit is configured to scale the estimate of received signal power based on a ratio of channel tap powers for the first and second receiver front-end circuits.

5. The automatic gain control circuit of claim 1, wherein the gain processor circuit is configured to scale the estimate of received signal power based on a ratio of channel tap and interference powers for the first and second receiver front-end circuits.

6. The automatic gain control circuit of claim 1, wherein the gain processor circuit is configured to scale the estimate of the received signal power based on a ratio of noise powers for the first and second receiver front-end circuits.

7. The automatic gain control circuit of claim 1, wherein the gain processor circuit is configured to set the second automatic gain control signal equal to the first automatic gain control signal.

8. The automatic gain control circuit of claim 1, wherein the gain processor circuit is configured to derive the second automatic gain control signal by calculating a ratio of channel tap powers between the first and second receiver front-end circuits, scaling a measurement used to calculate the first automatic gain control signal by the ratio, and calculating the second automatic gain control signal from the scaled measurement.

9. The automatic gain control circuit of claim 1, wherein the gain processor circuit comprises a portion of a baseband signal processing circuit included in the terminal.

10. The automatic gain control circuit of claim 1, wherein the gain processor circuit is configured to calculate the first automatic gain control signal based on a received signal power estimate determined by tracking a power of received signal samples from at least the first receiver front-end circuit.

11. The automatic gain control circuit of claim 10, wherein the gain processor circuit is configured to maintain the received signal power estimate as a smoothed estimate of the power of the received signal samples from at least the first receiver front-end circuit.

12. The automatic gain control circuit of claim 10, wherein the gain processor circuit is configured to derive the second automatic gain control signal based on a scaled received signal power estimate obtained by scaling the received signal power estimate as a function of channel tap powers for the first and second receiver front-end circuits.

13. The automatic gain control circuit of claim 1, wherein the gain processor circuit is configured to calculate a first automatic gain control signal for controlling a gain of the first receiver front-end circuit based on evaluating a combination of received signal samples from two or more receiver front-end circuits.

14. A method of automatic gain control in a wireless communication terminal comprising two or more receiver front-end circuits, the method comprising:
    calculating a first automatic gain control signal based on evaluating received signal samples from at least a first one of the receiver front-end circuits;
    deriving, for each additional receiver front-end circuit, one or more additional automatic gain control signals from the calculation of the first automatic gain control signal by:
        determining a scaling value relating the first receiver front-end circuit to the additional receiver front-end circuit;
        obtaining a scaled measurement by applying the scaling value to a measurement used in calculating the first automatic gain control signal; and
        calculating the automatic gain control signal for the additional receiver front-end circuit based on the scaled measurement; and
    controlling a gain of the first receiver front-end circuit via the first automatic gain control signal, and controlling gains of the one or more additional receiver front-end circuits via the one or more additional automatic gain control signals.

15. The method of claim 14, wherein deriving one or more additional automatic gain control signals from the calculation of the first automatic gain control signal comprises deriving at least a second automatic gain control signal for a second one of the receiver front-end circuits.

16. The method of claim 14, wherein deriving one or more additional automatic gain control signals from the calculation of the first automatic gain control signal comprises setting one or more additional automatic gain control signals for a corresponding one or more additional receiver front-end circuits to be equal to the first automatic gain control signal.

17. The method of claim 14, wherein determining a scaling value relating the first receiver front-end circuit to the additional receiver front-end circuit comprises calculating a ratio of channel tap powers between the first receiver front-end circuit and the additional receiver front-end circuit, or calculating a ratio of channel tap and interference powers between the first receiver front-end circuit and the additional receiver front-end circuit.

18. The method of claim 14, wherein determining a scaling value relating the first receiver front-end circuit to the additional receiver front-end circuit comprises calculating a ratio of noise powers between the first receiver front-end circuit and the additional receiver front-end circuit.

19. The method of claim 14, wherein calculating a first automatic gain control signal based on evaluating received signal samples from at least a first one of the receiver front-end circuits comprises maintaining an estimate of received signal power based on received signal samples from at least the first receiver front-end circuit and calculating the first automatic gain control signal therefrom.

20. The method of claim 19, wherein deriving one or more additional automatic gain control signals from the calculation of the first automatic gain control signal comprises scaling the estimate of received signal power for an additional receiver front-end circuit and calculating the automatic gain control signal for that additional receiver front-end circuit based on the scaled estimate of received signal power.

21. The method of claim 20, wherein scaling the estimate of received signal power for an additional receiver front-end circuit comprises determining a ratio relating channel tap powers of the first and additional receiver front-end circuits, and applying that ratio to the estimate of received signal power.

22. The method of claim 21, further comprising determining the ratio further based on relating interference and noise powers of the first and additional receiver front-end circuits.

23. The method of claim 14, wherein calculating a first automatic gain control signal based on evaluating received signal samples from at least a first one of the receiver front-end circuits comprises tracking a received power of signal samples output from the first receiver front-end circuit.

24. The method of claim 23, wherein tracking a received power of signal samples output from the first receiver front-end circuit comprises maintaining a smoothed estimate of the received power.

25. The method of claim 14, wherein calculating a first automatic gain control signal based on evaluating received signal samples from at least a first one of the receiver front-end circuits comprises tracking a received power of signal samples output from the first receiver front-end circuit and from at least a second one of the additional receiver front-end circuits.

26. The method of claim 14, wherein calculating a first automatic gain control signal based on evaluating received signal samples from at least a first one of the receiver front-end circuits comprises evaluating a combination of received signal samples from two or more receiver front-end circuits.

27. A wireless communication terminal for use in a wireless communication network, the terminal comprising:
a receiver comprising at least first and second receiver front-end circuits;
said receiver further comprising an automatic gain control circuit comprising a gain processor circuit configured to:
calculate a first automatic gain control signal for controlling a gain of the first receiver front-end circuit based on evaluating received signal samples from at least the first receiver front-end circuit; and
derive a second automatic gain control signal from the calculation of the first automatic gain control signal for controlling a gain of the second receiver front-end circuit by:
determining a scaling value relating the first receiver front-end circuit to the second receiver front-end circuit;
obtaining a scaled measurement by applying the scaling value to a measurement used in calculating the first automatic gain control signal; and
calculating the second automatic gain control signal based on the scaled measurement.

28. The terminal of claim 27, wherein the gain processor circuit further comprises an output circuit configured to output the first and second automatic gain control signals for controlling the gains of the first and second receiver front-end circuits, respectively.

29. The terminal of claim 27, wherein the gain processor circuit comprises a first gain control calculation circuit configured to calculate the first automatic gain control signal, and a second gain control calculation circuit configured to derive the second automatic gain control signal from the calculation of the first automatic gain control signal.

30. The terminal of claim 27, wherein the gain processor circuit comprises a portion of a baseband signal processing circuit included in the terminal.

31. The terminal of claim 27, wherein the gain processor circuit is configured to calculate the first automatic gain control signal based on tracking a power of received signal samples from at least the first receiver front-end circuit.

32. The terminal of claim 27, wherein the gain processor circuit is configured to derive the second automatic gain control signal from the calculation of the first automatic gain control signal based on selling the second automatic gain control signal to be equal to the first automatic gain control signal.

33. The terminal of claim 27, wherein the gain processor circuit is configured to determine the scaling value by calculating a ratio of channel tap powers between the first receiver front-end circuit and the second receiver front-end circuit, or by calculating a ratio of channel tap and interference powers between the first receiver front-end circuit and the second receiver front-end circuit.

34. The terminal of claim 27, wherein the gain processor circuit is configured to determine the scaling value by calculating a ratio of noise powers between the first receiver front-end circuit and the second receiver front-end circuit.

35. The terminal of claim 27, wherein the gain processor circuit is configured to calculate the first automatic gain control signal by maintaining an estimate of received signal power based on received signal samples from at least the first receiver front-end circuit and calculating the first automatic gain control signal therefrom.

36. The terminal of claim 35, wherein the gain processor circuit is configured to derive the second automatic gain control signal by scaling the estimate of received signal power and calculating the second automatic gain control signal based on the scaled estimate of received signal power.

37. The terminal of claim 36, wherein the gain processor circuit is configured to scale the estimate of received signal power by determining a ratio relating channel tap powers of the first and second receiver front-end circuits, and applying that ratio to the estimate of received signal power.

38. The terminal of claim 37, wherein the gain processor circuit is configured to determine the ratio further based on relating interference and noise powers of the first and second receiver front-end circuits.

39. The terminal of claim 27, wherein the gain processor circuit is configured to calculate a first automatic gain control signal for controlling a gain of the first receiver front-end circuit based on evaluating a combination of received signal samples from the first and second receiver front-end circuits.

* * * * *

UNITED STATES PATENT AND TRADEMARK OFFICE
CERTIFICATE OF CORRECTION

PATENT NO. : 7,242,914 B2
APPLICATION NO. : 10/869761
DATED : July 10, 2007
INVENTOR(S) : Khayrallah It is certified that error appears in the above-identified patent and that said Letters Patent is hereby corrected as shown below:

On the Face Page, in Field (73), under "Assignee", in Column 1, Line 2, after "(publ)" insert -- , Stockholm --.

In Column 7, Line 15, delete "a" and insert -- at --, therefor.

In Column 7, Line 28, delete " $r_n^A \mp C^A * s_n$ and $r_n^B \mp C^B * s_n$ " and insert -- $r_n^A \approx C^A * s_n$ and $r_n^B \approx C^B * s_n$ , --, therefor.

In Column 7, Line 29, after "that" insert -- the --.

In Column 8, Line 22, Equation (10), delete " $\tilde{Q}_k^A = \tilde{Q}_k^B \neq 1;2 Q_k^{AB}$ " and insert -- $\tilde{Q}_k^A = \tilde{Q}_k^B = \frac{1}{2} Q_k^{AB}$ --, therefor.

In Column 8, Line 50, delete " $r_n^A \mp C^A * s_n$ and $r_n^B \mp C^B * s_n$ " and insert -- $r_n^A \approx C^A * s_n$ and $r_n^B \approx C^B * s_n$ , --, therefor.

In Column 14, Line 54, in Claim 32, delete "selling" and insert -- setting --, therefor.

Signed and Sealed this

Second Day of June, 2009

JOHN DOLL
*Acting Director of the United States Patent and Trademark Office*